(12) United States Patent
Chiu et al.

(10) Patent No.: US 7,498,257 B2
(45) Date of Patent: Mar. 3, 2009

(54) METHODS FOR METAL ARC LAYER FORMATION

(75) Inventors: Hsing-Hua Chiu, Xindian (TW); Tuung Luoh, Taipei (TW); Chi-Tung Huang, Hsinchu (TW); Kuang-Chao Chen, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 11/329,553

(22) Filed: Jan. 11, 2006

(65) Prior Publication Data

US 2007/0161204 A1 Jul. 12, 2007

(51) Int. Cl.
*H01L 21/4763* (2006.01)
(52) U.S. Cl. ............... 438/636; 438/952; 257/E21.039
(58) Field of Classification Search .............. 438/400, 438/636, 952
See application file for complete search history.

(56) References Cited

U.S. PATENT DOCUMENTS

| | | | | |
|---|---|---|---|---|
| 5,231,053 A | * | 7/1993 | Bost et al. ................. | 438/627 |
| 5,814,560 A | * | 9/1998 | Cheung et al. .............. | 438/648 |
| 5,994,217 A | * | 11/1999 | Ng .............................. | 438/636 |
| 6,410,986 B1 | * | 6/2002 | Merchant et al. ............ | 257/763 |
| 6,492,270 B1 | * | 12/2002 | Lou ............................ | 438/687 |
| 2004/0074869 A1 | * | 4/2004 | Wang et al. ................... | 216/63 |
| 2004/0241466 A1 | * | 12/2004 | Chang et al. ................ | 428/469 |
| 2005/0048788 A1 | * | 3/2005 | Tang et al. .................. | 438/720 |
| 2006/0094232 A1 | * | 5/2006 | Su et al. ..................... | 438/637 |
| 2006/0121730 A1 | * | 6/2006 | Weng et al. ................. | 438/638 |

OTHER PUBLICATIONS

Jeffrey A. Shields, "Metal Rework Yield Loss—Mechanisms and Solutions", IEEE 1999, pp. 143-146.

* cited by examiner

*Primary Examiner*—Alexander G Ghyka
*Assistant Examiner*—Reema Patel
(74) *Attorney, Agent, or Firm*—Noel C. Gillespie

(57) ABSTRACT

A process for forming an ARC layer in the fabrication of a semiconductor device comprises forming a modified ARC layer that increases the resistance to crown defects and bridging and also provides better adhesion for the ARC layer with the underlying metal layer. The modified ARC layer can comprise two titanium nitride ARC layers, a titanium nitride/titanium/titanium nitride sandwich structure, a modified titanium nitride layer, or an extended thickness titanium nitride layer.

8 Claims, 5 Drawing Sheets

METHODS FOR METAL ARC LAYER FORMATION

BACKGROUND

1. Field of the Invention

The invention relates generally to the fabrication of metal layers and interconnects for semiconductor devices and more particularly to the fabrication of modified ARC layer structures.

2. Background of the Invention

Metal layers and interconnects are important technologies in semiconductor manufacturing. Interconnects electrically connect different conductive wiring layers in a semiconductor chip. The conductor layers can be layers formed on a substrate surface, such as a source/drain contacts or gate structures, or overlaying metal wiring layers. It is important that the interconnects, vias, and conductive wiring layers be reliable, be a small as possible to miniaturize the circuits, and have wide process windows for high yields.

Often, antireflective coating (ARC) layers are formed over the metal layers and interconnects. The ARC layers, which often comprised titanium nitride anti reflective coating, are used to improve photolithographic processes by providing a dull surface overlying the reflective metal lines.

In addition to the overlaying ARC layers, metal layers are formed having underlying barriers, such as TiN, etc. Such layers are critical in helping the metal layers, which usually comprised aluminum, to adhere to various surfaces, such as oxides. The layers also block aluminum metal from spiking out and reacting with other surfaces, such as silicon. The combinations of layers is often referred to as the metal stack.

One problem that can occur when the ARC layer is too thin, e.g., <600 A, is an effect known as a crown defect. Crown defects are illustrated in FIGS. 1A through 1C. In FIG. 1A, crown defects 101 and 102 can be seen extending from metal interconnects 107. A close up view of a crown defect 103 is illustrated in FIG. 1B. FIG. 1C illustrates another crown defect 104 extending from a metal line 105.

The main cause of crown defect formation is the penetration of aqueous developer through the ARC layer onto the underlying metal layer from which metal lines, e.g. lines 105 and 107, are formed during subsequent photolithographic steps. The aqueous developers comprise strong alkaline solutions that can remove the protective metal oxide from the metal surface and enhance the metal surfaces susceptibility to galvanic corrosion, e.g. as a result of rinse water during a rework process.

Bridging is another problem that can also occur. FIG. 1A illustrates the bridging problem. Bridging occurs when a defect forms that bridges one metal line to another. Thus, in area 106 of FIG. 1A it can be seen that several bridges have formed bridging metal lines 107.

Both the problems of crown defects and bridging will reduce the yield and increase processing cost.

SUMMARY

A process for forming an ARC layer in the fabrication of a semiconductor device comprises forming a modified ARC layer that increases the resistance to crown defects and bridging and also provides better adhesion for the ARC layer with the underlying metal layer.

In one aspect, a modified ARC layer comprises two titanium nitride ARC layers.

In another aspect, a modified ARC layer comprises a titanium nitride/titanium/titanium nitride sandwich structure.

In another aspect, a modified ARC layer comprises a modified titanium nitride layer.

In another aspect, a modified ARC layer comprises an extended thickness titanium nitride layer.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

Figure 1A:
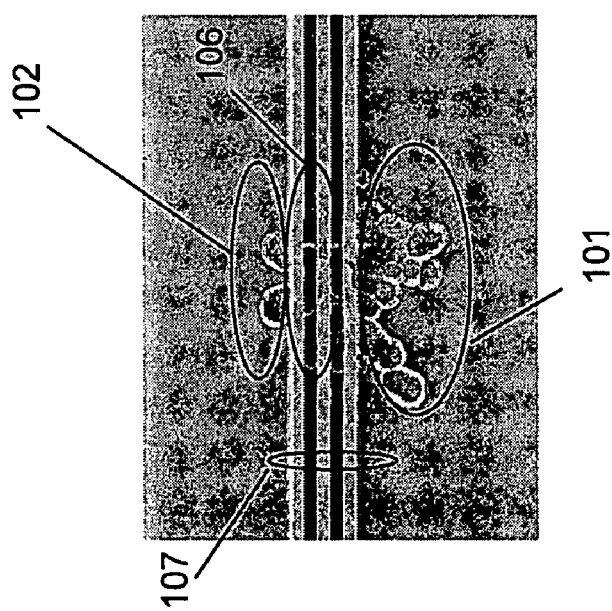
FIGS. 1A through 1C are diagrams illustrating defects affecting metal lines formed in a metal layer of a semiconductor device.
Figure 1B:
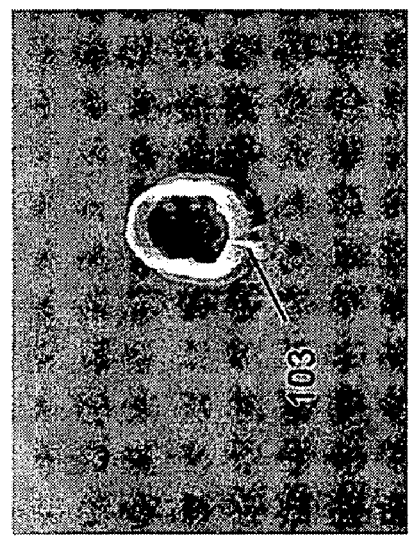
Figure 1C:
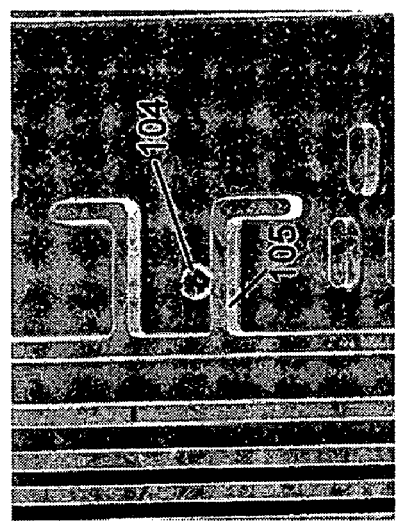
Figure 2:
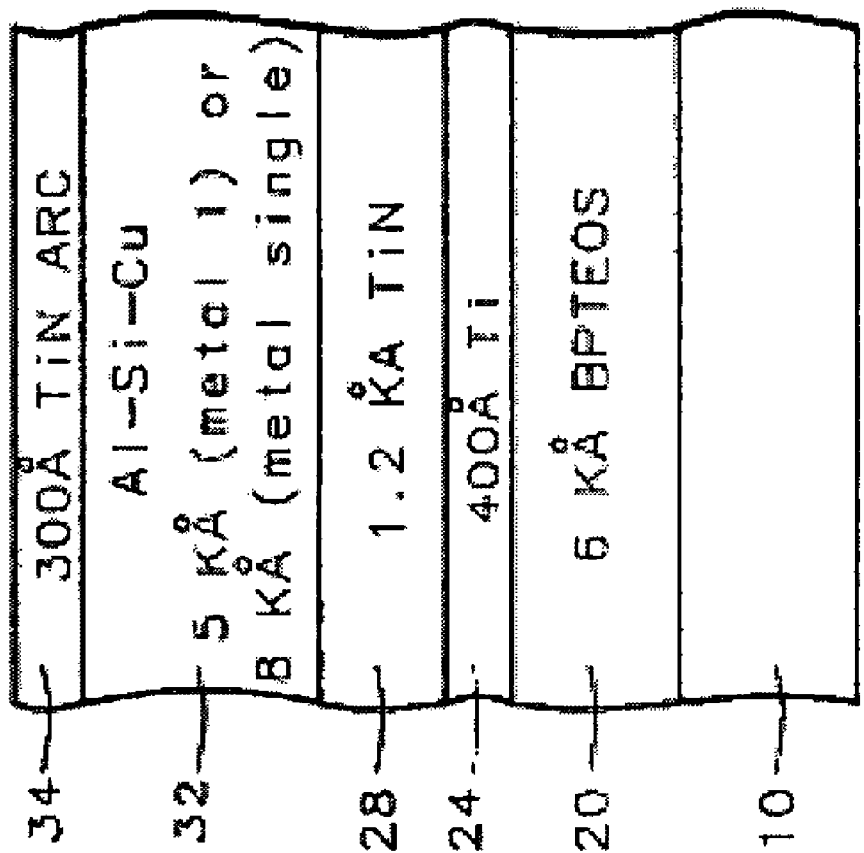
FIG. 2 is a diagram illustrating an exemplary metal stack for a semiconductor device.

FIG. 2 is a diagram illustrating an exemplary metal stack structure for a semiconductor device. The structure of FIG. 1 illustrates the lowest first interconnection layer contacting the substrate. First, a semiconductor structure 10 can be provided. Semiconductor structure 10 can comprise a silicon substrate with devices, e.g., source and drain regions, formed over a substrate. Semiconductor structure 10 can also comprise insulating and conductive layers formed over a substrate and patterned layers, such as gate electrodes and word lines.

A first insulating layer 20, which can, depending on the embodiment, be composed of Borophosphosilicate glass (BPSG), can be formed over semiconductor structure 10. Insulating layer 20 can preferably be formed using a BPTEOS oxide process and, depending on the embodiment, can have a thickness in the range of about 4,000 to 10,000 A. It can be preferable, for example, for the thickness of insulating layer 20 to be about 5,500 A.

Next, a titanium layer 24 can be formed over first insulating layer 20. Titanium layer 24 can have a thickness in the range of about 100-500 A and can, e.g., preferably have a thickness of about 400 A. Titanium layer 24 can be sputter deposited on insulating layer 20.

Next, a titanium nitride (TiN) barrier layer 28 can then be deposited over titanium layer 24. The TiN barrier layer preferably has a thickness in a range of about 1000-2000 A and in certain embodiments can more preferably have a thickness of about 1200 A. TiN barrier layer can be included in order to prevent junction spiking, i.e., aluminum diffusing into the silicon layers.

A metal layer 32, e.g., composed of aluminum, can then be formed over barrier layer 28. Metal layer 32 can, for example, compose Al/Cu/Si. Metal layer 32 can be sputtered, e.g., at a temperature in the range of between 270 and 520° C. For example, in certain embodiments it can be preferable that metal layer 32 be sputtered onto barrier layer 28 at a temperature of about 300° C. It should be noted, however, that the high sputter temperature can contribute to metal line stress, because the high temperature of the metal deposition can contribute to changes in the film structure that can eventually be manifest as stress.

In certain embodiments, metal layer 32 can have a composition of a Si wt % in a range of about 0.75 to 0.85 and a Cu wt % in a range of about 0.45-0.55. For example, in one embodiment metal layer 32 can have about 0.8 wt % Si-0.5 wt % Cu-98.7% Al.

Metal layer 32 can be deposited in a sputter by bombarding a metal ingot with plasma. Other metal deposition processes are also suitable. For example, the metal target can be an aluminum ingot comprising about 0.75-0.85% silicon and 0.45-0.55% copper, with the balance of 99.999995% purity aluminum. The aluminum, which is vaporized by the plasma, is deposited on the semiconductor surface. The aluminum alloy layer can be sputter deposit from a single target containing Al, Cu, and Si, at an DC power energy of between about 9.0 and 11.0 kW at a wafer temperature of about 270 to 520° C., and a gas ambient of argon and at a pressure between about 9E-8 and 5E-6 Torr.

Next, an ARC layer 34 can be deposited over metal layer 32. ARC layer 34 often comprises a titanium nitride layer. ARC layer 34 is formed over the metal lines, which are formed in metal layer 32. The anti-reflective properties improve lithography resolution by reducing reflectance off of the metal layer. ARC layer 34 can be formed by a sputtering process by reacting an excess of $N_2$ with a Ti metal target. Layer 34 can, e.g., have a reflectivity in a range of between about 0.25 and 0.6. For example, it can be preferable for ARC layer 34 to have a reflectivity of about 0.3.

Figures 3A, 3B, 3C, 3D, 3E:
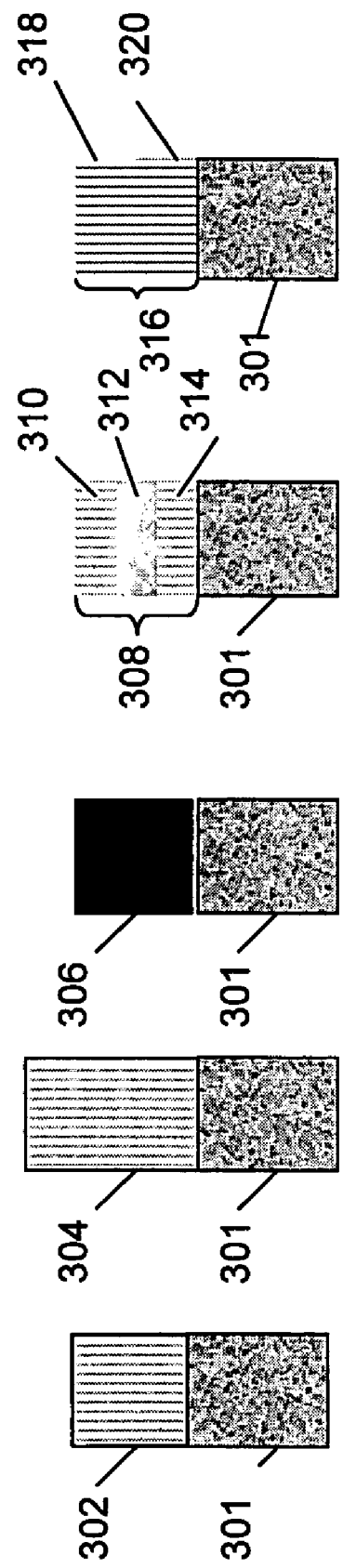
FIG. 3A is a diagram illustrating a close up of the metal layer and ARC layer for the metal stack of FIG. 2.
FIGS. 3B through 3E are diagrams illustrating close up views of the metal layer and modified ARC layers in accordance with various embodiments.

As mentioned above, if ARC layer 34 is too thin, e.g., <600 A, then defects such as crown defects and bridging can occur as a result of the subsequent penetration of the aqueous developer through ARC layer 34 to metal layer 32. ARC layer 34 can be modified, however, in order to reduce the like layer that the aqueous developer will penetrate through layer 34. FIGS. 3B through 3E illustrate several example embodiments of modified ARC layers 34. FIG. 3A illustrates a close up of a metal layer 301 and ARC layer 302. Metal layer 301 can, for example be an aluminum metal layer and ARC layer 302 can, for example, be a titanium nitride ARC layer. Thus, if ARC layer 302 is less than approximately 600 A, then defects such as crown defects and bridging can occur. In FIG. 3B an extended, or thicker, ARC layer 304 is used. ARC layer 304 can still comprise a titanium nitride ARC layer, but the thickness can, e.g., be approximately 750 A. While using a thicker ARC layer, such as ARC layer 304, can reduce defects such as crown defects and bridging, it should also be kept in mind that a thicker ARC layer can increase peeling, which can create problems in itself.

In FIG. 3C, a modified ARC layer 306 has been used. Modified ARC layer 306 can, e.g., comprise an amorphous titanium nitride layer as opposed to the more conventional columnar titanium nitride used in conventional processes.

FIG. 3D illustrates an embodiment in which a sandwich structure 308 is used for the ARC layer. In the example of FIG. 3D, sandwich layer 308 comprises a titanium layer 312 sandwiched between two titanium nitride layers 310 and 314. It can be shown, that a sandwich structure, such as sandwich structure 308 can have superior performance when the metal stack has gone through multiple developer steps. For example, testing has shown that a sandwich structure, such as sandwich structure 308, can have superior performance in terms of reducing defects when the metal stack has gone through four developer steps.

FIG. 3E is a diagram illustrating a multi-layer ARC layer structure 316. In the example of FIG. 3E, multi-layer structure 316 comprises a first titanium nitride layer 318 and a second titanium nitride layer 320. Structure 316 can be preferable, because the two-layer structure can be used without extending the thickness of ARC layer 34. For example, the TEMs of FIGS. 4A and 4B show that a dual titanium nitride layer 316 can result in an ARC layer of approximately the same thickness as the conventional ARC layer.

Figure 4A:
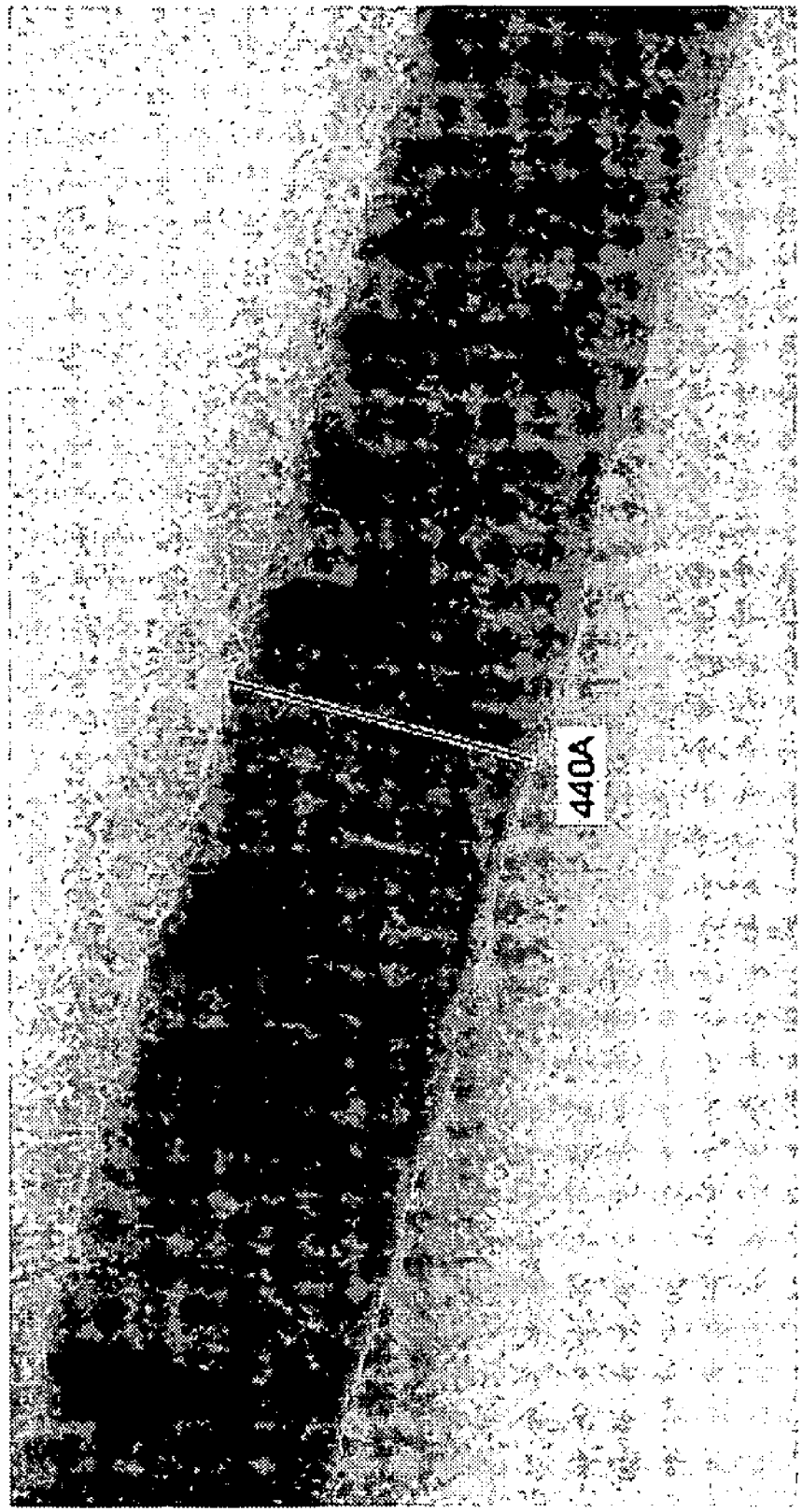
FIGS. 4A and 4B are TEMs illustrating that a modified ARC layer can be the same thickness as a standard ARC layer.
Figure 4B:
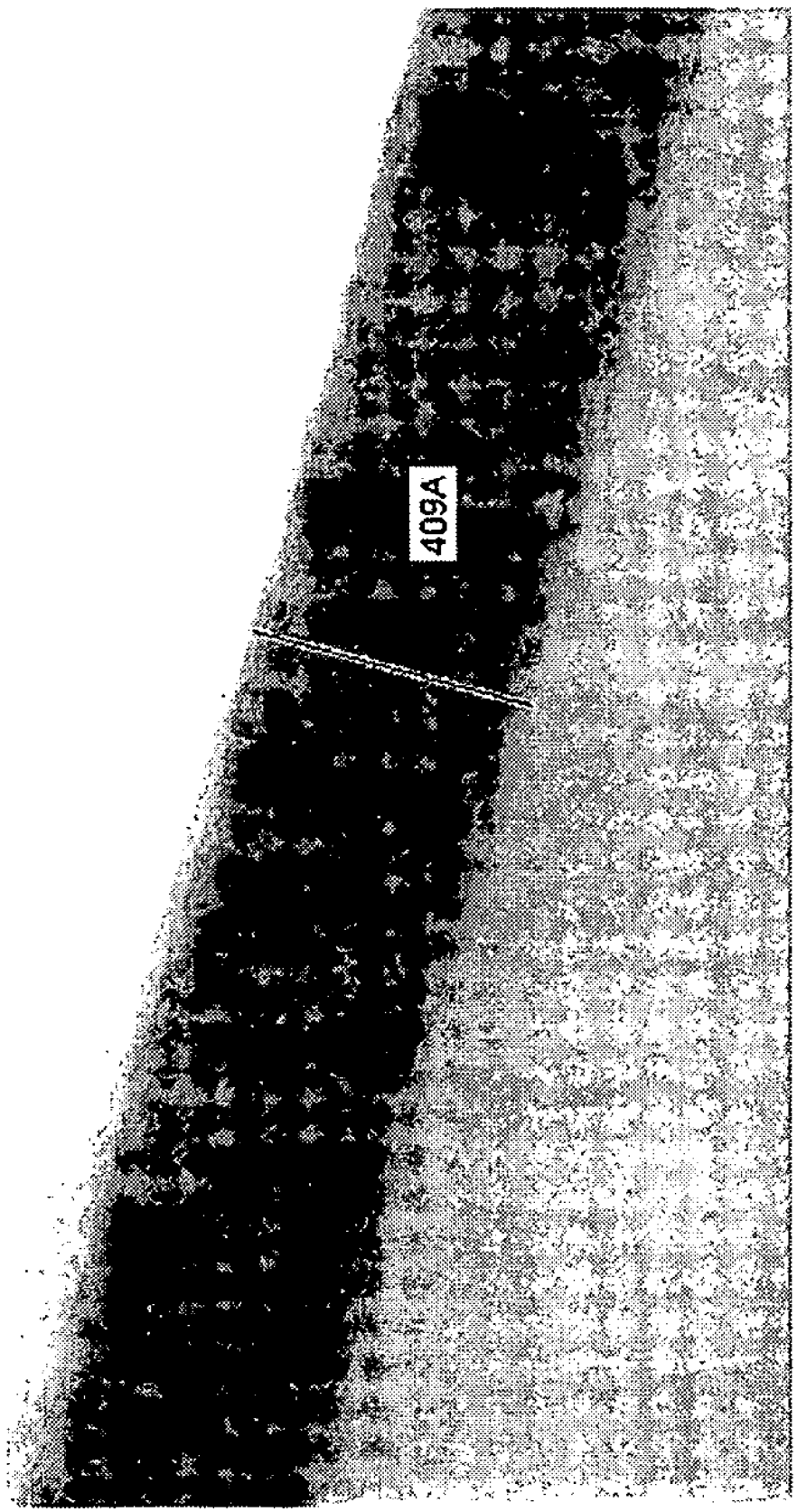

In the example of FIG. 4A, a single 400-angstrom titanium nitride ARC layer was deposited. In the example FIG. 4B, however, a 200-angstrom titanium nitride layer was deposited, followed by a pump purge step, followed by the deposition of a second 200-angstrom titanium nitride layer.

It can be shown that the use of two titanium nitride layers 318 and 320 can reduce the crown defects and bridging that can plague conventional processes. Further, the use of dual titanium nitride layers, such as in the example of FIG. 3 can be preferable because it can result in an overall ARC layer 316 that is of the same thickness as a conventional ARC layer.

Further, it can be shown that forming ARC layer 316 using two titanium nitride layers can actually improve the adhesion of ARC layer 316 with metal layer 301. In order to maintain, or increase throughput, both layers 318 and 320 can be deposited in a single chamber.

Thus, the dual titanium nitride structure 316 illustrated in FIG. 3E can be preferable because it can resolve the crown defect and bridging problems without extending the ARC layer thickness, can provide better adhesion than a single titanium nitride layer, and does not have any impact on throughput.

The improved ARC layers described above can be applied to the formation of many different semiconductor devices. In particular, the improved ARC layer structures can be applied in the fabrication of flash devices, DRAM devices, and OTP devices.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for fabricating an ARC layer over a metal layer, comprising:
    forming a first ARC TiN layer directly in contact with the metal layer;
    forming an ARC Ti layer over the first ARC TiN layer; and
    forming a second ARC TiN layer over the ARC Ti layer, the combined thickness of the Ti layer and the first and second ARC TiN layers being less than approximately 600 Å, wherein the ARC layer prevents penetration of aqueous developer through the ARC layer onto the metal layer.

2. The method of claim 1, wherein forming a first ARC TiN layer comprises forming a first ARC TiN layer of approximately 200 Å.

3. The method of claim 1, wherein forming a second ARC TiN layer comprises forming a second ARC TiN layer of approximately 200 Å.

4. The method of claim 1, wherein the combined thickness of the ARC Ti layer and the first and second ARC TiN layers is approximately 400 Å.

5. The method of claim 1, wherein the metal layer comprises of Al/Cu/Si.

6. The method of claim 1, further comprising forming an insulating layer over the semiconductor structure.

7. The method of claim 6, further comprising forming a Ti layer over the insulating layer.

8. The method of claim 7, further comprising forming a barrier layer over the Ti Layer, wherein the first ARC layer is formed over the barrier layer.

* * * * *